United States Patent [19]

Ikeda et al.

[11] 4,089,020
[45] May 9, 1978

[54] HIGH POWER SEMICONDUCTOR DIODE

[75] Inventors: Takahide Ikeda, Kodaira; Michio Ishikawa, Hachioji, both of Japan

[73] Assignee: Hitachi, Ltd., Japan

[21] Appl. No.: 677,807

[22] Filed: Apr. 16, 1976

[30] Foreign Application Priority Data

Apr. 16, 1975 Japan .................................. 50-45282

[51] Int. Cl.² ..................... H01L 29/48; H01L 29/56; H01L 29/64
[52] U.S. Cl. ........................................ 357/15; 357/56; 357/58
[58] Field of Search ............................. 357/15, 58, 56

[56] References Cited

U.S. PATENT DOCUMENTS

| T944,004 | 3/1976 | Altman et al. | 357/71 |
|---|---|---|---|
| 3,738,877 | 6/1973 | Davisohn | 357/15 |
| 3,742,317 | 6/1973 | Shao | 357/15 |
| 3,770,606 | 11/1973 | Lepselter | 357/15 |
| 3,897,275 | 7/1975 | Borrelo et al. | 357/15 |
| 3,907,595 | 9/1975 | Lindmayer | 357/15 |

OTHER PUBLICATIONS

RCA Engineer; Schottky Barrier Devices, by R. T. Sells, pp. 68 to 73, Jan. 18, 1972.
RCA Technical Notes; Gallium Arsenide Photoportion Semiconductor Device, by Carl Stocker RCA TN, No. 536, Mar., 1962 pp. 1 of 2 & 2 of 2.
P–N Schottky Hybrid Cold Cathode Diode, by C. A. Stolte et al., Applied Physics Letters, vol. 19 No. 11, Dec., 1971, pp. 497 and 498.

Primary Examiner—Andrew J. James
Attorney, Agent, or Firm—Craig & Antonelli

[57] ABSTRACT

A semiconductor diode consists of a low resistivity n conductivity type semiconductor substrate, a high resistivity n conductivity type semiconductor layer, formed on the surface of the substrate, a high resistivity p conductivity type semiconductor layer, whose thickness is smaller than the diffusion length of electrons, formed on the n conductivity type layer, a metal electrode forming a Schottky barrier contact with the p conductivity type layer, and an electrode forming an ohmic contact with the substrate.

4 Claims, 8 Drawing Figures

HIGH POWER SEMICONDUCTOR DIODE

BACKGROUND OF THE INVENTION

The present invention relates to a semiconductor diode.

DESCRIPTION OF THE PRIOR ART

Requirements for semiconductor diodes, particularly power semiconductor diodes, include a small voltage drop in the forward direction so that power loss is small, a high withstand voltage, and a small leakage current when a voltage is applied across the two terminals of the diode in the backward direction, and also a high response speed.

Among conventional types of diodes, the *p-i-n* type diode has a disadvantage in that the response speed is low, and on the other hand the Schottky type diode has a disadvantage in that the potential drop in the forward direction is great for high current densities and also the leakage current is great when it is biased in the reverse direction.

SUMMARY OF THE INVENTION

One object of this invention is to provide high performance diodes, which do not have the drawbacks of the above-mentioned *p-i-n* type or Schottky type diodes and satisfy the above requirements for power semiconductor diodes.

In order to achieve the above-mentioned object a semiconductor diode according to this invention consists of a low resistivity *n* conductivity type semiconductor substrate, a high resistivity *n* conductivity type semiconductor layer, formed on the substrate, a high resistivity *p* conductivity type semiconductor layer, whose thickness is smaller than the diffusion length of electrons, formed on the *n* conductivity type layer, a metal electrode forming a Schottky barrier contact with the *p* conductivity type layer, and an electrode forming an ohmic contact with the substrate.

This invention is based on experiments on the junction characteristics of the transition region between the Schottky type and the *p-n* junctions by doping an *n* conductivity type region adjacent to a Schottky barrier type contact with *p* conductivity type impurities. That is, the inventors of this invention have found that a diode having the above-mentioned structure has a higher response speed than the traditional *p-i-n* type diode, a smaller potential drop in the forward direction for high current densities and a smaller leakage current, when it is biased in the backward direction. Furthermore, since *a* junction is formed in a semiconductor layer, the diode according to this invention is more reproducible and more reliable than a Schottky barrier type diode.

One of the most important characteristics of the diode of this invention is that the thickness of the *p* conductivity type layer is smaller than the diffusion length of electrons injected from the *n* conductivity type layer to the *p* conductivity type layer. It has been experimentally verified that, owing to this structure, the diffusion potential of the *p-n* junction and the injection efficiency of minority carriers from the *p* conductivity type layer are governed principally by the total quantity of impurities in the *p* conductivity type layer and that they depend only minimally on the form of the distribution of the impurities. Accordingly, the junction characteristics of the diode can be controlled by the total quantity of impurities in the *p* conductivity type layer.

For low current densities, since the characteristics in the forward direction of the diode of this invention depend on the diffusion potential, the potential drop in the forward direction increases with the increasing quantity of impurities in the *p* conductivity type layer. On the other hand, for high current densities, for which the resistivity of the *n* the conductivity type layer plays an important role, conductivity modulation effect becomes more important and the potential drop in the forward direction increases more slowly with an increasing quantity of impurities in the *p* conductivity type layer. Power semiconductor diodes are used mainly in a current density region from 100 to 300 A/cm$^2$. Diodes according to this invention are specifically useful for this high current density region because the most effective method for reducing the power loss is to decrease the potential drop in the forward direction as much as possible.

Other characteristics and advantages of this invention will be described hereinbelow referring to some preferred embodiments in conjunction with the acompanying drawing. However, it should be understood that there are various modifications and variations without departing from the spirit of this invention.

DESCRIPTION OF THE PREFERRED EMBODIMENTS

Embodiment 1

Figure 1:
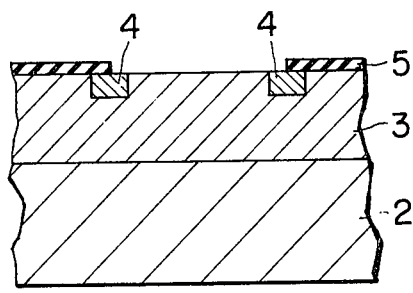
FIGS. 1 to 3 are cross-sectional views representing the process for fabricating a diode according to this invention by the ion implantation method.
Figure 2:
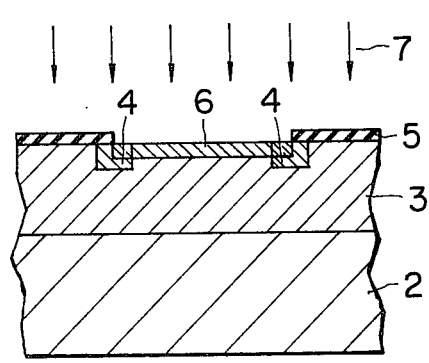
Figure 3:
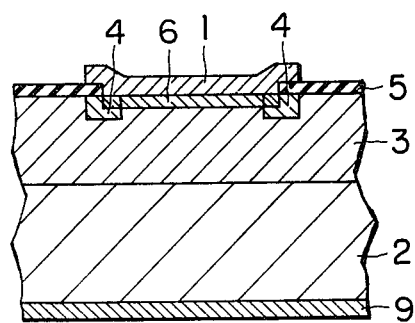

FIGS. 1 to 3 are cross-sectional views representing the process for fabricating a diode having the above-mentioned structure by doping a surface portion of a semiconductor body with *p* conductivity type impurities at a low concentration by the ion implantation method.

An *n* conductivity type silicon layer 3 having a specific resistivity of 6 Ω cm and a thickness of 6 μm is grown epitaxially on the surface of a low resistivity *n* conductivity type silicon substrate 2 having a specific resistivity of 0.01 Ω cm and a thickness of 150 μm. As is shown in FIG. 1, a ring-shaped high impurity concentration *p* conductivity type region 4, which is 2 μm thick, is formed by a selective diffusion method in a surface portion of the *n* conductivity type layer 3. An SiO$_2$ mask layer 5 deposited on the surface has a circular window bounded by the ring-shaped region 4.

Boron ions 7 are implanted through this window in the circular portion at a dose of 10$^{12}$ cm$^{-2}$ with an acceleration energy of 100 keV to form a *p* conductivity type layer 6, which is about 0.6 μm thick, as indicated in FIG. 2. The implanted layers are annealed at a temperature of 800° C for 10 minutes in a dry atmosphere. The ring-shaped region 4 surrounding the *p* conductivity type layer 6, prevents deterioration of the characteristics of the junction formed between the p conductivity type layer 6 and the n conductivity type layer 3. That is, it serves as a guard ring for the junction.

An Al layer is deposited all over the surface and then an Al electrode 1 is formed by selectively etching the Al layer by the well-known photolithographic method, as illustrated in FIG. 3. An ohmic contact 9 is formed on the other side of the substrate 2.

The junction characteristics of a diode thus obtained were measured and it was found that the potential drop in the forward direction was 0.73 V at a current density of 100 A/cm$^2$ and that its breakdown voltage in the reverse direction was 120 V. This potential drop in the forward direction is smaller by 0.1 to 0.2 V than that of well-known diodes having a withstand voltage of the same order of magnitude as that of the diode of this invention.

Figure 4:
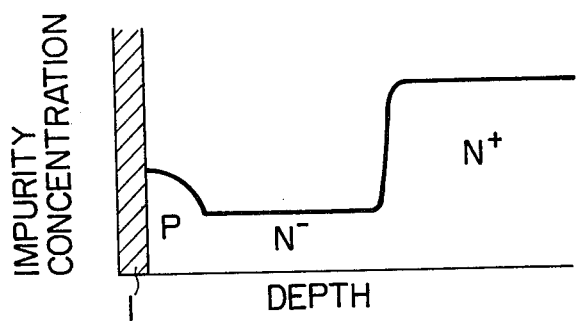
FIG. 4 represents the impurity concentration distribution in the diode according to this invention.

FIG. 4 schematically represents the impurity distribution of the diode of this invention, where the reference numeral 1 designates the Al electrode.

Figure 5:
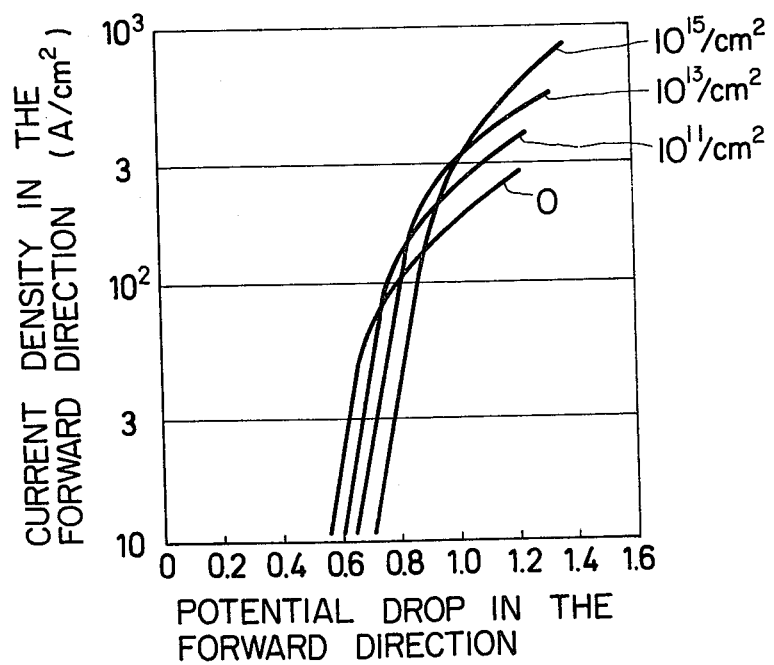
FIG. 5 shows an example of experimental results on the junction characteristics.

Junction characteristics were measured by varying the impurity concentration in the p conductivity type layer for silicon diodes fabricated by the above-mentioned method, the n conductivity type layer of which was 4 to 15 μm thick and had a specific resistivity of 1 to 20 Ωcm. FIG. 5 shows the relationship between the current density in A/cm$^2$ and the potential drop in V in the forward direction for a diode having a structure according to this invention fabricated by implanting boron ions with an acceleration energy of 100 keV at various doses in an n conductivity tyype layer 10 μm thick having a specific resistivity of 10 Ω cm. The implanted impurity ion doses are between $10^{11}$ and $10^{15}$ cm$^{-2}$ and indicated in the figure. The curve for which the implanted impurity ion dose is zero, of course shows the junction characteristics of a conventional Schottky diode.

It can be seen from the figure that the potential drop in the forward direction is small in an impurity dose region between $10^{11}$ and $10^{13}$ cm$^{-2}$ for current densities between 100 and 300 A/cm$^2$. The results are almost the same as those obtained for n conductivity type layers 4 to 15 μm thick having a specific resistivity between 1 and 20 Ω cm. The low resistivity n, conductivity type silicon substrate used for this experiment was 150 μm thick and had a resistivity of 0.01 Ω cm.

It has also been verified that leakage current in the backward direction of the diodes according to this invention, for which the p conductivity type layer is doped with impurities at a dose between $10^{11}$ and $10^{13}$ cm$^{-2}$, is smaller by about 1 to 2 orders of magnitude than those obtained for conventional Schottky diodes and that the recovery time in the reverse direction, in which current in the backward direction reaches a stationary state when the voltage applied to the diodes is changed from the forward to the backward direction, is one half to one third the time required for diodes in which the dose of ions implanted in the p conductivity type layer is as high as $10^{15}$ cm$^{-2}$. However, in the case where the n conductivity type layer is thicker than 15 μm, since a potential drop due to the series resistance in that layer is too large, the dose of ions implanted in the p conductivity type layer should be greater than $10^{13}$ cm$^{-2}$.

As indicated above, according to this invention, it is possible to obtain a diode having much better characteristics such as the potential drop in the forward direction, response speed, and leakage current in the backward direction than conventional diodes for a current density range around 100 to 300 A/cm$^2$, by forming a p conductivity type layer, in which the dose of ions is in the range between $10^{11}$ and $10^{13}$ cm$^{-2}$, to a depth smaller than the diffusion length of electrons, measured from the surface in an n conductivity type layer having a thickness of 4 to 15 μm and a resistivity of 1 to 20 Ω cm.

Embodiment 2

Figure 6:
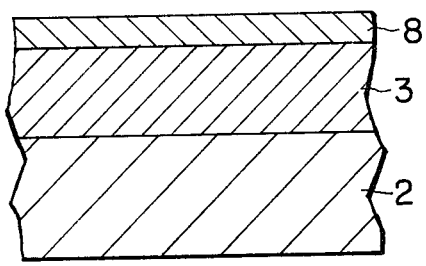
FIGS. 6 to 8 are cross-sectional views representing the process for fabricating the diode according to this invention by the epitaxial growth method.
Figure 7:
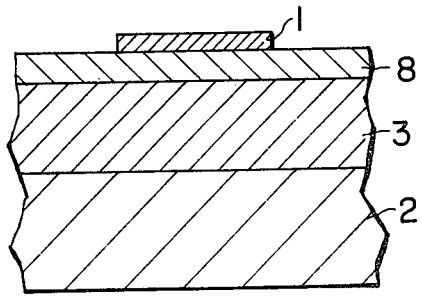
Figure 8:
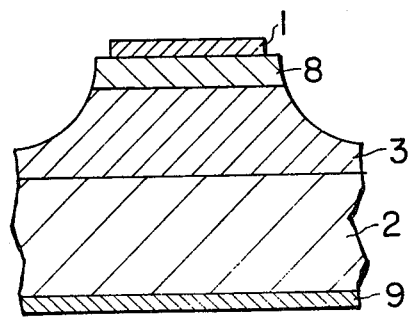

FIGS. 6 to 8 are cross-sectional views representing the process for fabricating another type of diode according to this invention.

An n conductivity type layer 3 having the same characteristics as those indicated in Embodiment 1 is grown epitaxially on the surface of a low resistivity n conductivity type substrate 2 having the same charateristics as those indicated in Embodiment 1. As shown in FIG. 6, a p conductivity type silicon layer 8 is grown on the surface of the n conductivity type layer 3. This p conductivity type layer has a resistivity of 1 Ω cm (impurity concentration $1.5 \times 10^{16}$ cm$^{-3}$) and a thickness of 2 μm, therefore a total amount of impurities per unit area of $3 \times 10^{12}$ cm$^{-2}$.

An Al layer is deposited on the surface of the p conductivity type layer 8 and then selectively etched, leaving an electrode 1 as shown in FIG. 7.

The p conductivity type layer 8 is selectively etched by the well-known photolithographic method so as to form a mesa type diode and an ohmic contact 9 is formed on the other side of the substrate 2, as shown in FIG. 8.

The diode thus obtained exhibits characteristics almost identical to those described in Embodiment 1. That has been, it is verified that the junction characteristics can be controlled by controlling the quantity of p conductivity type impurities independently of the method by which the p conductivity type layer is formed.

As mentioned previously, the depth of the p conductivity type layer is smaller than the diffusion length of electrons. The diffusion length of minority carriers in the p conductivity type layer depends on the impurity concentration and the lifetime of minority carriers in the p conductivity type layer. For an impurity concentration region smaller than $10^{18}$ cm$^{-3}$, which is dealt with in this invention, the diffusion length of electrons is greater than 5 μm. Thus, this requirement is satisfied, if the thickness of the p conductivity type layer is less than 5 μm. The easiest methods for doping a semiconductor layer with the required small total amount of impurities per unit area are the ion implantation method and the epitaxial growth method, as described in the above embodiments.

What is claimed is:

1. A semiconductor diode comprising, in combination:
   an n conductivity type semiconductor substrate having a low resistivity;
   an n conductivity type semiconductor layer, having a resistivity from 1 to 20 Ω cm and a thickness from 4 to 15 μm, disposed on the surface of said substrate;
   a p conductivity type semiconductor layer, having a maximum thickness of 5 μm and an impurity concentration per unit area from $10^{11}$ to $10^{13}$ cm$^{-2}$, disposed at the surface of said n conductivity type semiconductor layer;

a first electrode forming a Schottky barrier contact with said $p$ conductivity type semiconductor layer; and an electrode in ohmic contact with said substrate.

2. A semiconductor diode according to claim 1, wherein said substrate is made of silicon.

3. A semiconductor diode according to claim 2, wherein said $p$-type layer is formed in the surface and is coplanar with the surface of said $n$-type layer.

4. A semiconductor diode according to claim 2, wherein said $p$-type layer is formed atop said $n$-type layer in the form of a mesa.

* * * * *